US007955915B2

(12) United States Patent
Liu et al.

(10) Patent No.: US 7,955,915 B2
(45) Date of Patent: Jun. 7, 2011

(54) ORGANIC FIELD EFFECT TRANSISTOR AND METHOD OF MANUFACTURING THE SAME

(75) Inventors: Chien-Cheng Liu, Miaoli (TW); Hsin-Fei Meng, Hsinchu (TW); Sheng-Fu Horng, Hsinchu (TW)

(73) Assignee: National Tsing Hua University, Hsin-chu (TW)

( * ) Notice: Subject to any disclaimer, the term of this patent is extended or adjusted under 35 U.S.C. 154(b) by 49 days.

(21) Appl. No.: 12/462,101

(22) Filed: Jul. 29, 2009

(65) Prior Publication Data
US 2010/0025667 A1 Feb. 4, 2010

(30) Foreign Application Priority Data
Jul. 31, 2008 (TW) .............................. 97128935 A

(51) Int. Cl.
*H01L 21/84* (2006.01)
(52) U.S. Cl. ................ 438/158; 257/E21.561
(58) Field of Classification Search .......... 438/151–166; 257/E21.561
See application file for complete search history.

(56) References Cited

U.S. PATENT DOCUMENTS
4,404,731 A * 9/1983 Poleshuk ...................... 438/158
4,461,031 A * 7/1984 Blamer ......................... 383/123
* cited by examiner

*Primary Examiner* — Richard A. Booth
(74) *Attorney, Agent, or Firm* — Hudak, Shunk & Farine Co. LPA

(57) ABSTRACT

The present invention discloses an organic field effect transistor and a manufacturing method thereof. The organic field effect transistor comprises a top-contact type or a bottom-contact type, and the manufacturing method thereof comprises the following steps: a substrate is provided, a metal gate is formed on the substrate, an inorganic insulating layer is formed on the substrate and the metal gate, a surface of the insulating layer is polished, an organic filler is filled in pores on the insulating layer as an insulating treatment, a modified layer is formed on the inorganic insulating layer, and finally an organic semiconductor layer, a source and a drain are formed. By combining the advantages of simply liquefied process of the organic material and the high stability of inorganic material, and operation conditions of control process, the present invention can achieve effectively that the device is high carrier mobility and high on/off ratio.

11 Claims, 8 Drawing Sheets

ORGANIC FIELD EFFECT TRANSISTOR AND METHOD OF MANUFACTURING THE SAME

FIELD OF THE INVENTION

The present invention relates to an organic field effect transistor and a manufacturing method thereof, and particularly relates to an organic field effect transistor with high carrier mobility and high on/off ratio and a manufacturing method thereof to reach the effect through proper process conditions and the use of an organic filler.

BACKGROUND OF THE INVENTION

Along with the advancement in technology, the applications of organic conductivity, semiconductor materials and polymeric materials have been developing in an extremely fast pace. Currently, more and more photoelectric industries have directed toward the use of organic materials as the basis of research and development. This is because a variety of organic materials are available at inexpensive prices, and compared to the fragility of the conventional glass and semiconductors, the organic materials are flexible to meet different design requirements. Meanwhile, in recent years, computers having extremely high operating speed and practical usefulness have been associated with increasingly grown networks and become closely related to people's daily life and work, which in turn brings the development in display devices. The manufacturing of an organic field effect transistor with high performance has, therefore, become an important key factor in providing high quality display devices.

A transistor can be generally divided into four parts, namely, a gate, an insulating layer, a source and a drain located at two opposite sides, and a semiconductor layer. The gate, the source, and the drain represent three different electrodes. Metals often used for forming these three electrodes are gold, silver, and alloy. The amplitude of the voltage supplied to the gate determines the on/off condition of the transistor; and the voltage of the drain determines the current flowed between the drain and the source while the transistor is in the on state. Due to the above-described electric field operation at the gate, we call this type of transistor as a field effect transistor. The efficiency of a transistor is determined by the carrier mobility, the current on/off ratio and the aspect ratio of the transistor structure. The higher the carrier mobility is, the more signals that can be processed. Generally speaking, a transistor having a semiconductor layer made of an organic material usually has carrier mobility lower than that of a transistor having a semiconductor layer made of an inorganic material. As to the effect of the aspect ratio of the transistor structure, it is not discussed herein.

Generally, the property of the insulating layer has relatively large influence on the property of the organic transistor. The surface condition of the insulating layer is an important factor in determining the carrier mobility of the organic semiconductor. For example, in the case of a polymeric material, poly(3-hexylthiophene) (P3HT), a good self-assembly crystal feature can occur on a relatively smooth surface of the insulating layer. However, this problem is not concerned in terms of a common organic transistor manufactured on a silicon substrate because a smooth and dense thermally oxidized layer can be grown on a substrate to obtain relatively high carrier mobility and low leak current at the gate. But, it is usually impossible to obtain such good device properties when the polymeric material semiconductor is further applied to the cheap and highly variable glass or plastic substrate. This is because the insulating layer formed on the glass or plastic substrate is pretty rough and has many defects. In this case, the leak current at the gate passing through the insulating layer will largely increase and the carrier mobility is relatively poor.

Therefore, it is desirable to develop a method for manufacturing an organic field effect transistor with high carrier mobility and high on/off ratio on a glass substrate or a plastic substrate at low manufacturing cost.

In view of the above-mentioned problems in the prior art, on the basis of engaging in research for many years and a lot of practical experience, the inventor proposes an organic field effect transistor and a manufacturing method thereof in an attempt to overcome the existing problems.

SUMMARY OF THE INVENTION

A primary object of the present invention is to provide an organic field effect transistor and a manufacturing method thereof, so as to solve the problem of unable to reach high carrier mobility and high on/off ratio by using organic materials on a glass substrate or plastic substrate.

To achieve the object, the present invention provides a top-contact type organic field effect transistor, comprising: a substrate; a metal gate formed on the substrate; an inorganic insulating layer formed on the substrate and the metal gate; an organic filler filled in pores on the surface of the inorganic insulating layer; a modified layer formed on the inorganic insulating layer for converting a hydrophilic surface of the inorganic insulating layer into a hydrophobic surface; a source and a drain formed on the modified layer; and an organic semiconductor layer formed to completely and continuously cover the source and the drain. Wherein, the organic semiconductor layer is used as a channel, and an end of the organic semiconductor layer is electrically connected to the source and the other end electrically is connected to the drain.

Besides, the present invention further provides a bottom-contact type organic field effect transistor, comprising: a substrate; a metal gate formed on the substrate; an inorganic insulating layer formed on the substrate and the metal gate; an organic filler filled in pores on the surface of the inorganic insulating layer; a modified layer formed on the inorganic insulating layer for converting a hydrophilic surface of the inorganic insulating layer into a hydrophobic surface; an organic semiconductor layer completely and continuously formed on the modified layer; and a source and a drain formed on the organic semiconductor layer. Wherein, the organic semiconductor layer is used as a channel, and an end of the organic semiconductor layer is electrically connected to the source and the other end electrically is connected to the drain.

In addition, a method provided by the present invention for manufacturing the above-described bottom-contact type organic field effect transistor, comprising the following steps. S1: A substrate is provided. S2: A metal gate is formed on the substrate. S3: An inorganic insulating layer is formed on the substrate and the metal gate. S4: A polishing treatment for the surface of the inorganic insulating layer is performed. S5: An insulating treatment for the inorganic insulating layer is performed by an organic filler. S6: A modified layer is formed on the inorganic insulating layer. S7: An organic semiconductor layer is formed on the modified layer. And S8: a metal is deposited to form a source and a drain. Wherein, in the method, the step S8 can be further performed after the step S6 to form a top-contact type field effect transistor.

In order to make it easier for the examiners to understand the technological characteristic and the achievements of the present invention, the following contents are provided with preferred embodiments and matched with detailed description.

DETAILED DESCRIPTION OF THE PREFERRED EMBODIMENTS

The following will refer to the related drawings to illustrate preferred embodiments of the organic field effect transistor and a manufacturing method thereof for the present invention.

Figure 1:
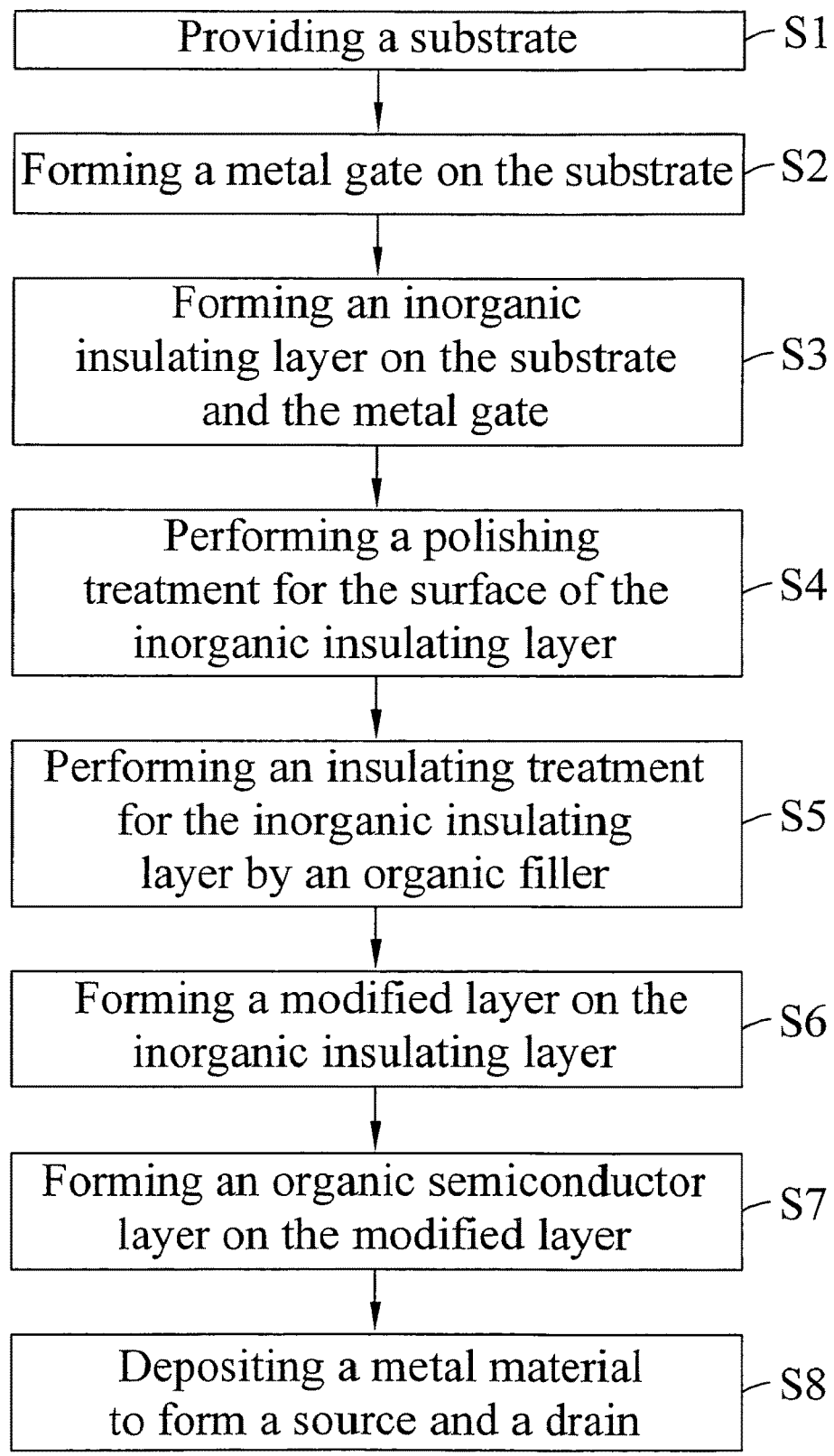
FIG. 1 is a flowchart showing a method for manufacturing an organic field effect transistor according to the present invention.

Please refer to FIG. 1 for a flowchart showing a method for manufacturing an organic field effect transistor according to the present invention. As shown, the method comprises the following steps. In the step S1, a substrate is provided. For example, the substrate may be a glass substrate, a plastic substrate, a soft and flexible substrate, or a substrate made of a material with a good water and oxygen resistant property. In the step S2, a metal gate is formed on the substrate. The preferable metal gate is chromium (Cr) or other metals of which RMS (Root Mean Square) is smaller than 1 nanometer. In this step, the metal gate can be formed on the substrate by way of vapor deposition.

Thereafter, in the step S3, an inorganic insulating layer is formed on the substrate and the metal gate. The inorganic insulating layer may be a hydrophilic or a hydrophobic material, such as silicon dioxide ($SiO_2$) or silicon nitride ($Si_3N_4$). In practice, in the step S3, the inorganic insulating layer may be formed by way of plasma-enhanced chemical vapor deposition (PECVD). Then, in the step S4, a polishing treatment is performed for a surface of the inorganic insulating layer. For example, the surface of the inorganic insulating layer may be subjected to plasma bombarding until the RMS of the inorganic insulating layer is lower than 1 nanometer.

In the step S5, an insulating treatment is performed for the inorganic insulating layer using an organic filler. Since pores on the surface of the insulating layer are one of the reasons for leak current at the gate, a type of organic filler, such as polyvinylpyrrolidone (PVP) or polymethylmethacrylate (PMMA), may be used to fill these pores to reduce the leak current at the gate. Then, in the step S6, a modified layer is formed on the inorganic insulating layer to change the hydrophilicity or hydrophobicity of the inorganic insulating layer and thereby facilitate the subsequent formation of an organic semiconductor layer on the inorganic insulating layer. For example, the modified layer can be formed on the inorganic insulating layer by treating the surface of the inorganic insulating layer using hexamethyldisilizane (HMDS) or octadecyltrichlorosilane (OTS), so as to convert a hydrophilic inorganic insulating layer into a hydrophobic inorganic insulating layer. Moreover, before the step S6, the surface treatment of the inorganic insulating layer may be proceeded by a ultra-violet (UV)/ozone method or a oxygen plasma method.

Then, in the step S7, an organic semiconductor layer is formed on the modified layer. Wherein the material of the organic semiconductor layer may be a small molecular material, such as pentacene; or a polymeric material, such as derivatives of thiophene or poly(3-hexylthiophene) (P3HT); or an organic material with high carrier mobility. Meanwhile, in the step S7, the organic semiconductor layer can be formed by a dip-coating method.

Figure 2:
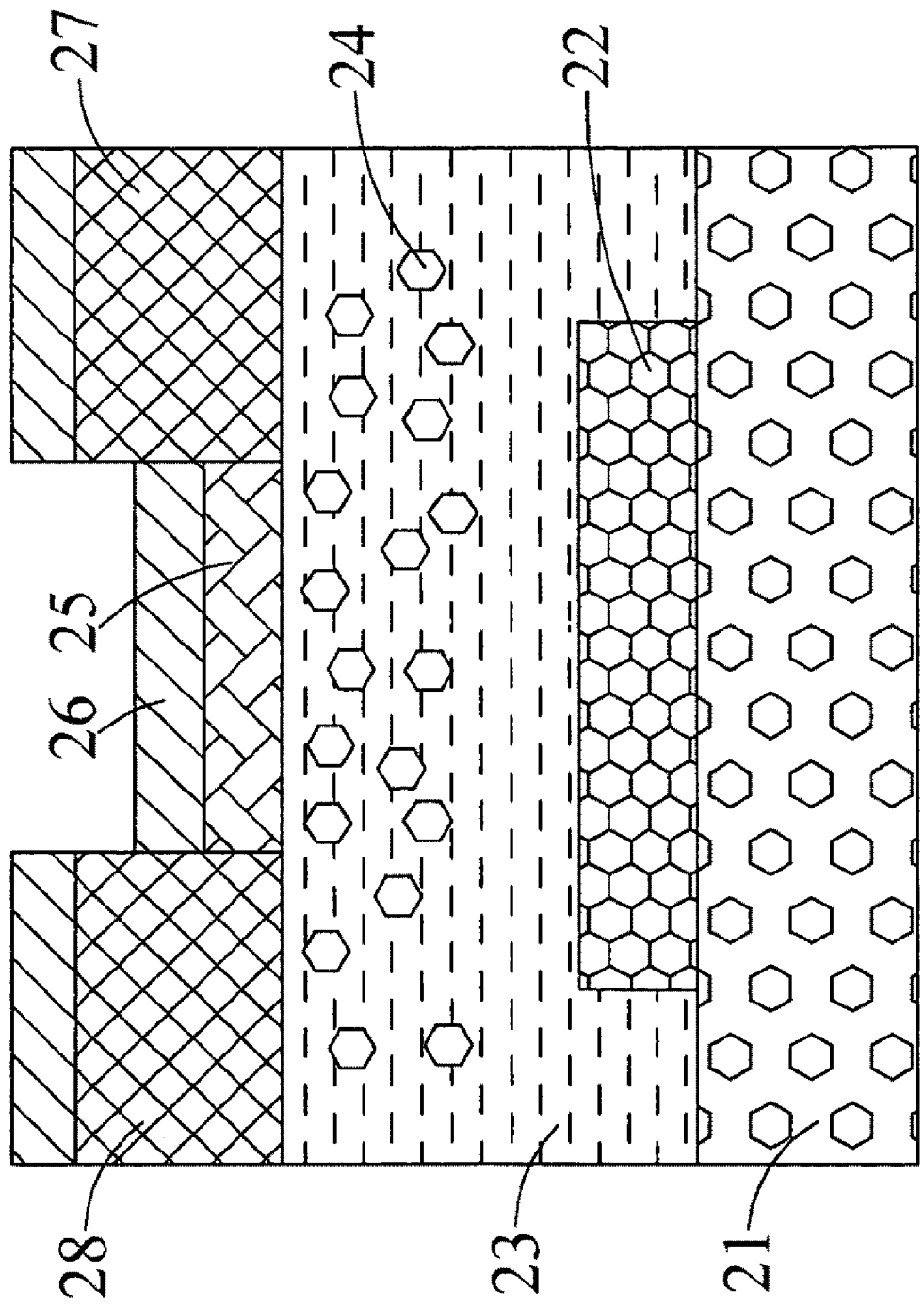
FIG. 2 is a schematic view showing the structure of a top-contact type organic field effect transistor according to the present invention.

Finally, in the step S8, a source and a drain are formed by depositing a metal material. The metal material may be an electrically conductive metal, such as poly(3,4-ethylenedioxythiophene) (PEDOT), copper (Cu), etc. When the step S8 has been performed, a bottom-contact type field effect transistor is completed. Furthermore, the step S8 in the above-described manufacturing method may be otherwise performed after the step S6 to thereby form a top-contact type field effect transistor. That is, the source and the drain are formed on the modified layer and then the organic semiconductor layer is formed on the modified layer, the source, and the drain. This is also another embodiment of the present invention, Please refer to FIG. 2 for a schematic view showing the structure of a top-contact type organic field effect transistor according to the present invention. As shown, the structure comprises a substrate 21, a metal gate 22, an inorganic insulating layer 23, an organic filler layer 24, a modified layer 25, a source 27 and a drain 28, and an organic semiconductor layer 26. The substrate 21 may be a glass substrate, a plastic substrate, a soft and flexible substrate, or a substrate made of a material with a good water and oxygen resistant property. The metal gate 22 is formed on the substrate 21. The metal gate 22 is chromium (Cr) or other metals of which RMS (Root Mean Square) is smaller than 1 nanometer.

The inorganic insulating layer 23 is formed on the substrate 21 and the metal gate 22, and the organic filler layer 24 is used to fill pores existed on the surface of the inorganic insulating layer 23. The inorganic insulating layer 23 can be silicon dioxide ($SiO_2$) or silicon nitride ($Si_3N_4$), and the organic filler layer 24 can be polyvinylpyrrolidone (PVP) or polymethylmethacrylate (PMMA). The modified layer 25 is formed on the inorganic insulating layer 23 to convert a hydrophilic surface of the inorganic insulating layer 23 into a hydrophobic surface. In practice, the surface treatment of the inorganic insulating layer 23 may be proceeded by using hexamethyidisilazane (HMDS) or octadecyltrichlorosilane (OTS) to form the modified layer 25 on the surface of the inorganic insulating layer 23.

The source 27 and the drain 28 are formed on the modified layer 25, and are formed using a metal material, which can be an electrically conductive metal, such as poly(3,4-ethylenedioxythiophene) (PEDOT), copper (Cu), etc. The organic semiconductor layer 26 is completely and continuously formed to cover the source 27 and the drain 28 as a channel. One end of the organic semiconductor layer 26 electrically is connected to the source 27 and the other end of the organic semiconductor layer 26 electrically is connected to the drain 28. The organic semiconductor layer 26 may be formed by a small molecular material, such as pentacene; or a polymeric material, such as derivatives of thiophene, or poly(3-hexylthiophene) (P3HT), etc; or an organic material with high carrier mobility.

Figure 3:
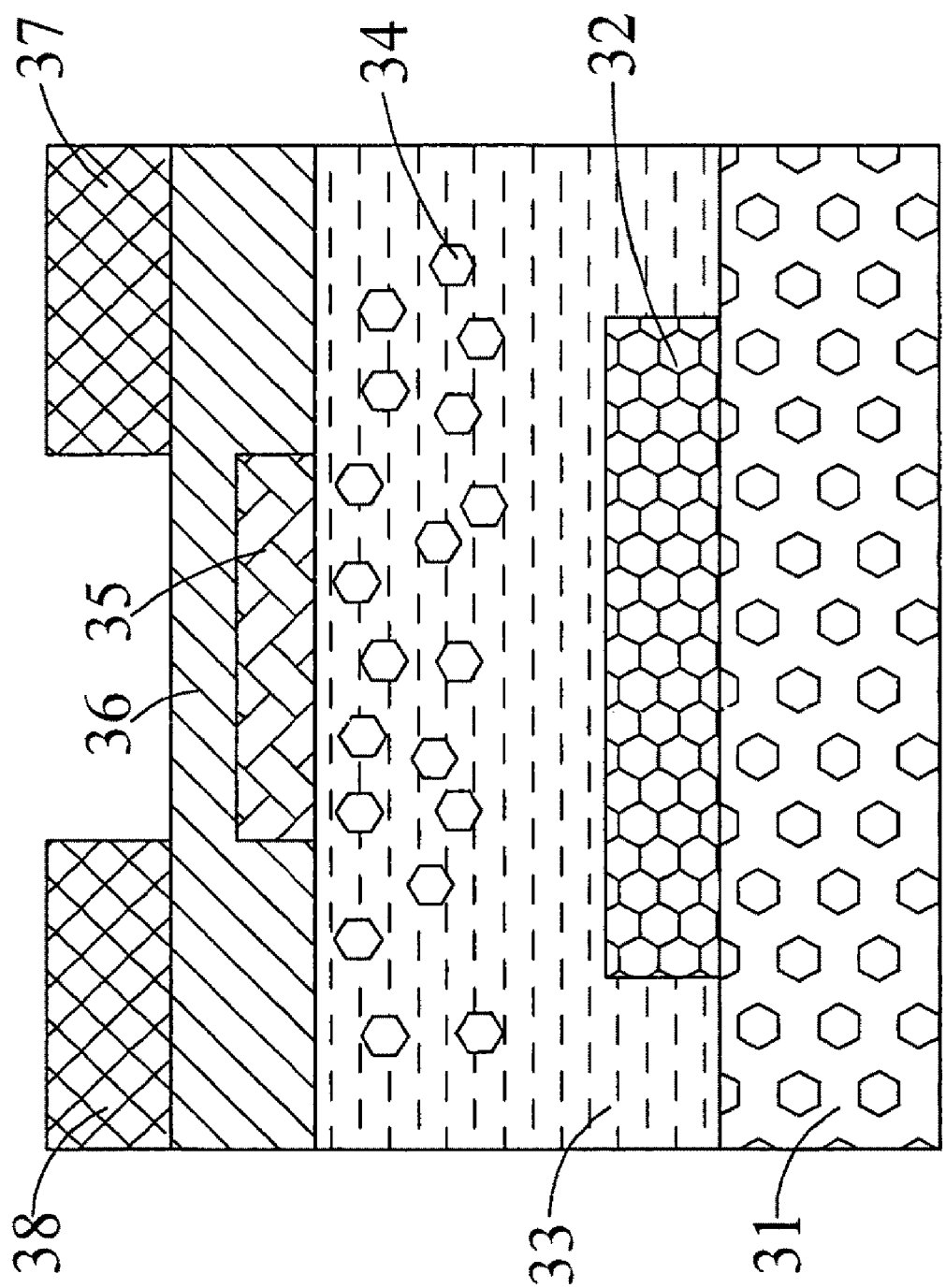
FIG. 3 is a schematic view showing the structure of a bottom-contact type organic field effect transistor according to the present invention.

FIG. 3 is a schematic view showing the structure of a bottom-contact type organic field effect transistor according to the present invention. The structure comprises a substrate 31, a metal gate 32 formed on the substrate 31, an inorganic insulating layer 33 formed on the substrate 31 and the metal gate 32, an organic filler layer 34 for filling pores on a surface of the inorganic insulating layer 33, a modified layer 35 formed on the inorganic insulating layer 33 to convert a hydrophilic surface of the inorganic insulating layer 23 into a hydrophobic surface, an organic semiconductor layer 36 completely and continuously formed on the modified layer 35, and a source 37 and a drain 38 formed on the organic semiconductor layer 36. Wherein, the organic semiconductor layer 36 functions as a channel with one end electrically connected to the source 37 and the other end electrically connected to the drain 38.

The substrate 31 can be a glass substrate, a plastic substrate, or a soft and flexible substrate, and is preferably made of a material with a good water and oxygen resistant property. The metal gate 32 may be chromium (Cr) or other metals of which RMS (roughness measurement system) is smaller than 1 nanometer. The inorganic insulating layer 33 may be silicon dioxide ($SiO_2$) or silicon nitride ($Si_3N_4$). The organic filler layer 34 may be polyvinylpyrrolidone (PVP) or polymethylmethacrylate (PMMA). The modified layer 35 may be hexamethyidisilazane (HMDS) or octadecyltrichlorosilane (OTS). The source 37 and the drain 38 may be an electrically conductive metal, such as poly(3,4-ethylenedioxythiophene) (PEDOT), copper (Cu), etc. The organic semiconductor layer 36 may be a small molecular material, such as pentacene; or a polymeric material, such as derivatives of thiophene, or poly(3-hexylthiophene) (P3HT).

Figure 4A:
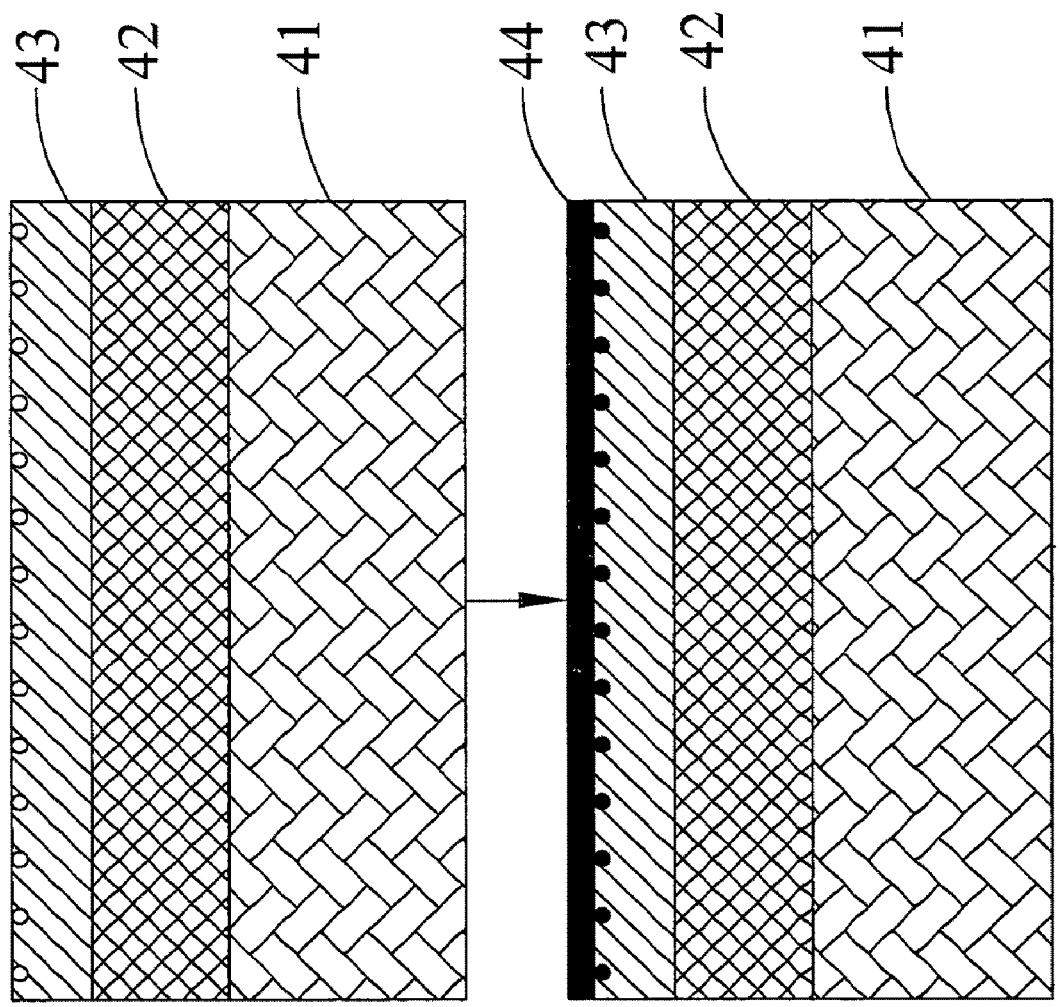
FIGS. 4A and 4B are schematic views for performing insulating treatment of the organic field effect transistor according to the present invention.
Figure 4B:
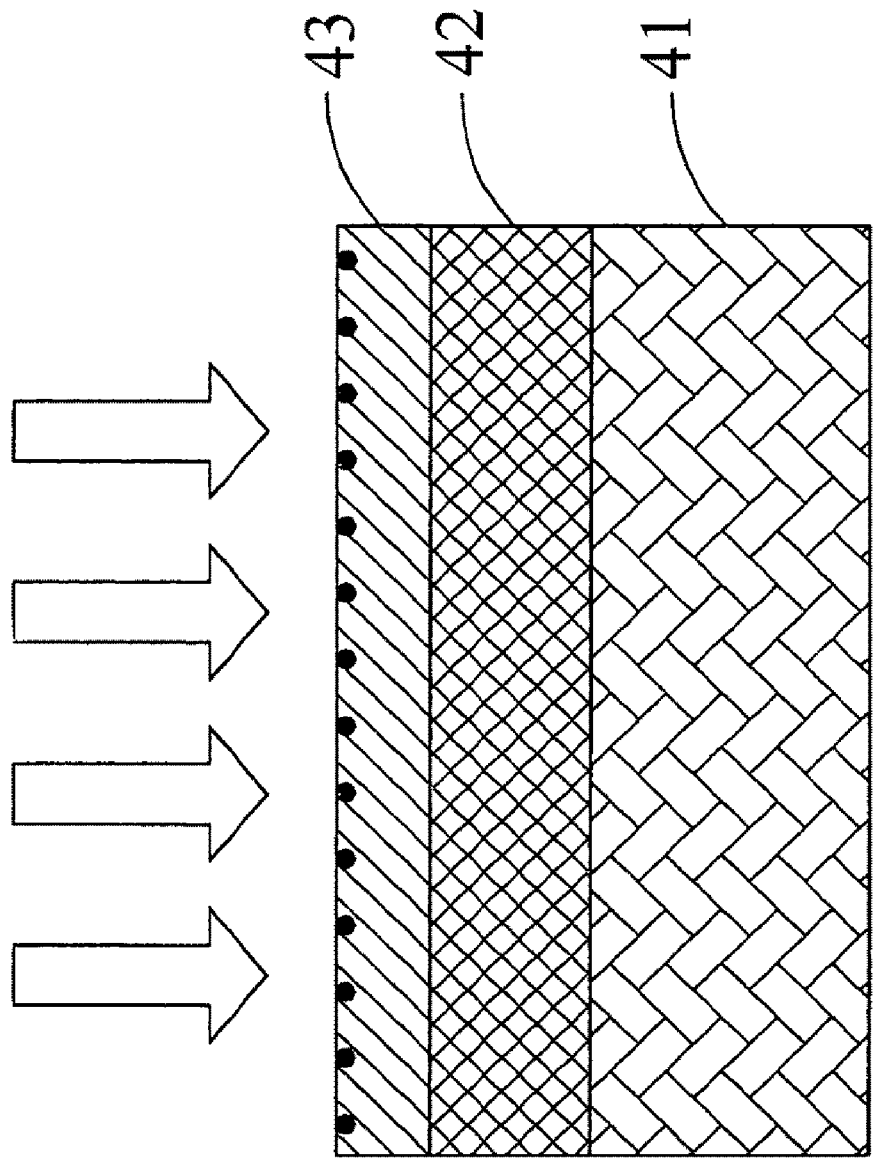

Please refer to FIGS. 4A and 4B, which are schematic views for performing insulating treatment of the organic field effect transistor according to the present invention. The organic field effect transistor illustrated in FIGS. 4A and 4B has a glass substrate 41, a metal gate 42 formed by deposited chromium, an inorganic insulating layer 43 formed by silicon dioxide, and an organic filler layer 44 formed by polyvinylpyrrolidone (PVP). And, isopropyl alcohol (IPA) is used as a solvent to dissolve the PVP.

As can be seen from FIG. 4A, the organic filler layer 44, which is a polymer solution, i.e. a PVP solution in IPA in this embodiment, is applied on the inorganic insulating layer 43 by dip coating to fill the pores on the surface of the inorganic insulating layer 43. Then, use IPA to rinse and clean the surface of the inorganic insulating layer 43 by way of spin rinse.

FIG. 4B shows the inorganic insulating layer 43 having been cleaned using IPA is subjected to a surface treatment using a UV/ozone process. As can be seen from FIG. 4B, the organic filler layer 44 above the surface of the inorganic insulating layer 43 is dissolved, and only the PVP filled in the surface pores of the inorganic insulating layer 43 is remained to thereby give the inorganic insulating layer 43 an enhanced insulating ability.

The following is an embodiment of a process procedure of a manufacturing method of an organic field effect transistor according to the present invention as detailed description.

(1) First, a glass substrate is provided. The glass substrate is immersed into an acetone (ACE) solvent and an isopropyl alcohol (IPA) solvent, and is oscillated using a supersonic oscillator for several seconds respectively so as to remove impurities adhered to the substrate. Then, a nitrogen spray gun is used to dry the substrate roughly. Finally, the substrate is placed on a heating plate to dry the remaining moisture on the substrate by heat.

(2) The cleaned glass substrate is put in a thermal evaporation apparatus, and then smooth chromium (Cr) is deposited by evaporation at a preset vacuum degree to form a metal gate of an organic field effect transistor.

(3) A silicon dioxide ($SiO_2$) insulating layer is formed over the Cr metal gate by plasma enhanced chemical vapor deposition (PECVD) method.

(4) A surface treatment of the insulating layer is proceeded by using arc plasma for a period of time, so as to increase its surface flatness.

(5) A polymer is used to fill pores on the surface of the insulating layer to reduce leak current at the metal gate. In this embodiment, PVP dissolved in IPA is applied to cover the surface of the inorganic insulating layer by dip coating. Then, using IPA to rinse and clean the surface by way of spin rinse. Finally, a UV/ozone process is used to remove the polymeric layer over the insulating layer, so that only the polymer filled in the pores is left.

(6) HMDS is used to proceed a surface treatment of the $SiO_2$ insulating layer to advantageously upgrade the self-organization ability thereof. HMDS can replace the hydroxyl group on the surface of the $SiO_2$ insulating layer to thereby convert an original hydrophilic into a hydrophobic $SiO_2$ insulating layer so as to attract an organic semiconductor layer. For example, the hexyl side chain of P3HT that forms an organic semiconductor layer is attracted to arrange toward an interface between the P3HT and the $SiO_2$ insulating layer.

(7) A source and a drain is formed by metal evaporation.

(8) Film-forming of an organic semiconductor is proceed. In this embodiment, regioregular poly(3-hexylthiophene-2,5-diyl) (rr-P3HT) is used to form the organic semiconductor layer, chloroform is used as a solvent, and a low water/oxygen glove box is used as a manipulating environment. A solution of rr-P3HT in chloroform having required concentration is prepared in advance, and then is sealed in a bottle, which is further entirely covered with aluminum foil to block light. The prepared solution is placed for 24 hours. On the next day, a device formed by performing the above steps (1) to (7) is putted in the glove box. The device is immersed in HMDS by dip-coating first. The device is then removed from the glove box and placed on a heating plate to dry for a period of time.

Since P3HT is highly photosensitive, light inside the glove box must be turned off when immersing the device into the P3HT, and a curtain externally around the glove box must be closed. The glove box is interiorly illuminated with red light. The device is immersed into the P3HT solution and then lifted at a fixed speed. After the dip coating is completed, a rear side and all edges of the device are wiped dry. The device is then placed in the glove box and the glove box is vacuumed for a period of time, and an organic field effect transistor of the present invention is obtained.

Figure 5:
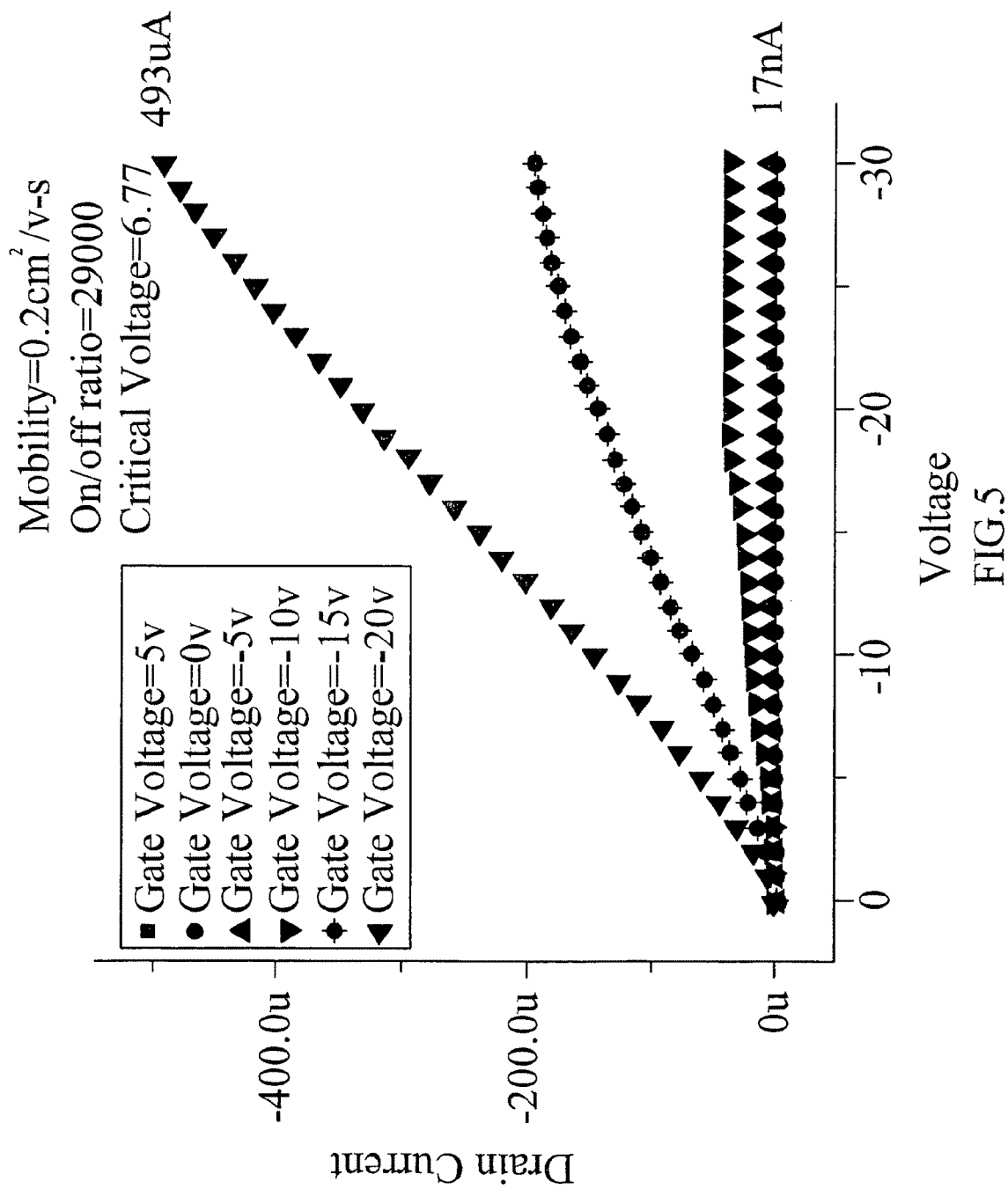
FIG. 5 is a testing diagram showing the carrier mobility of the organic field effect transistor according to the present invention.

FIG. 5 is a testing diagram showing the carrier mobility of the organic field effect transistor according to the present invention. After computation, a hole carrier mobility larger than 0.1 $cm^2$/V-s and an on/off ratio larger than $10^4$ ($Id_{on}$ at Vg=−20V/$Id_{off}$ at Vg=5V) are obtained.

Figure 6A:
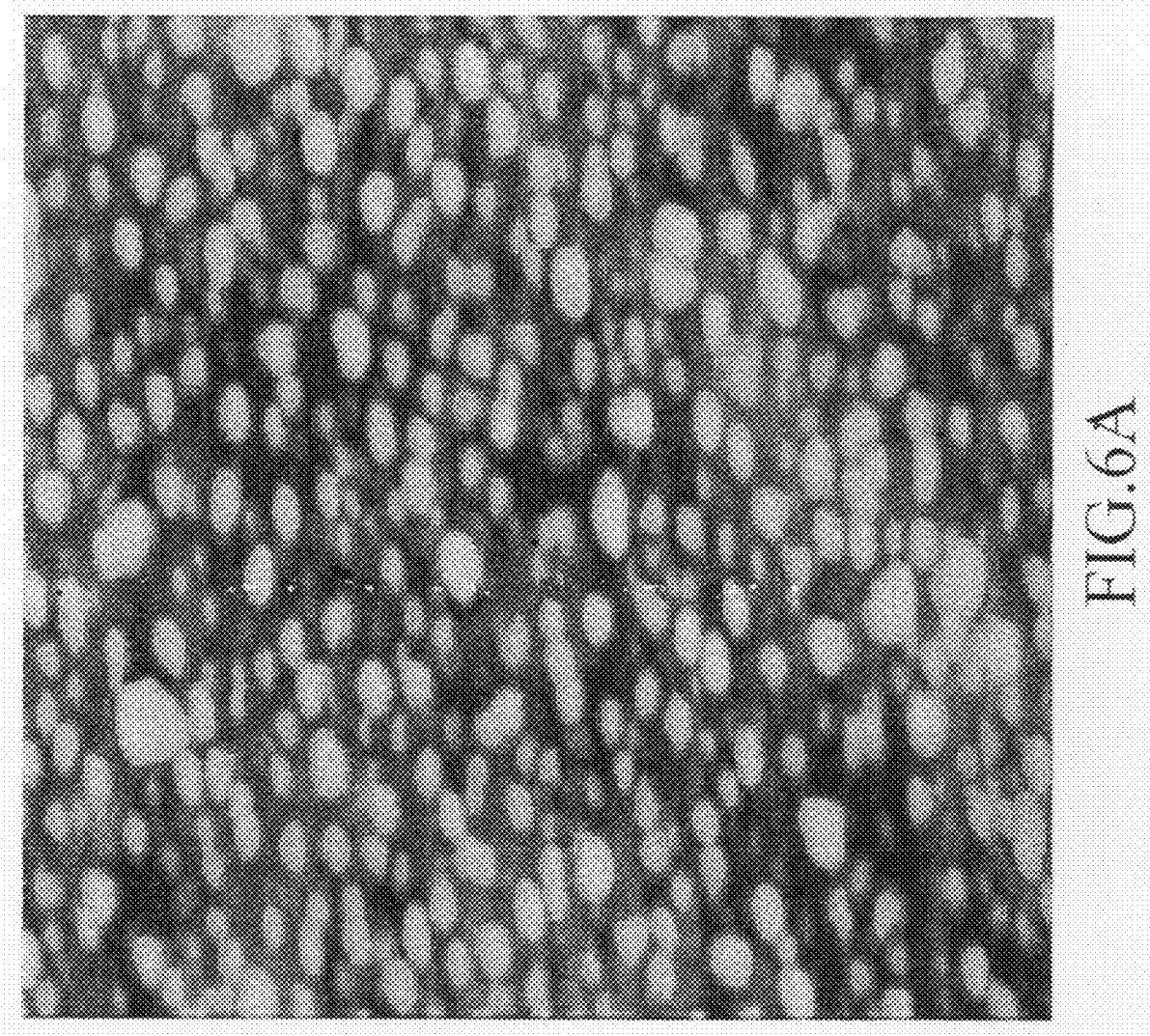
FIG. 6A is an atomic force microscopic image of the surface of the insulating layer of the organic field effect transistor according to the present invention before the surface is treated by plasma bombarding.
Figure 6B:
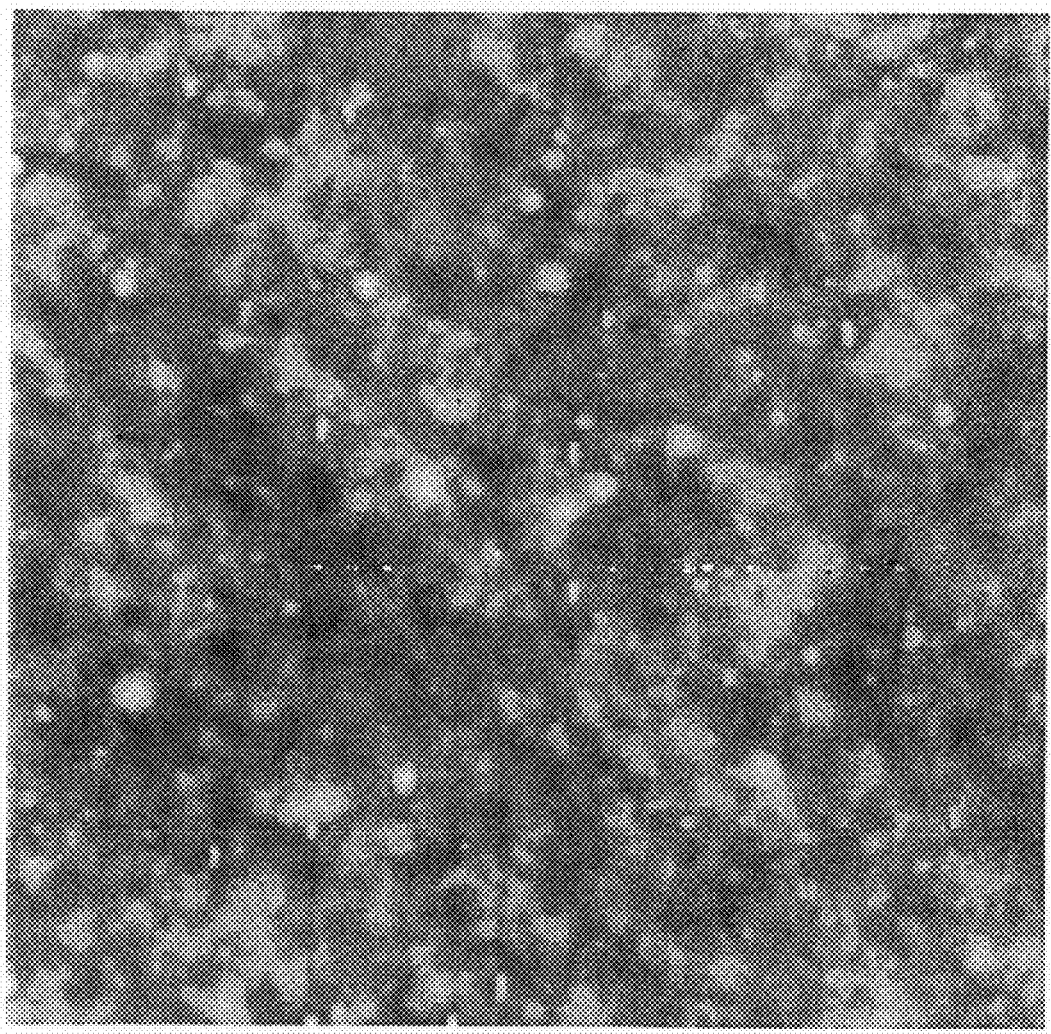
FIG. 6B is an atomic force microscopic image of the surface of the insulating layer of the organic field effect transistor according to the present invention after the surface is treated by plasma bombarding.

FIGS. 6A and 6B are atomic force microscopic images of the surface of the insulating layer of the organic field effect transistor according to the present invention before and after plasma bombarding process, respectively. As shown in FIG.

6A, when an atom force microscope (AFM) is used to measure the flatness of the surface of the insulating layer before plasma bombarding, it can be found a plurality of white tiny protrusions are densely distributed over the insulating layer. However, after undergoing an argon plasma bombarding process, the white tiny protrusions are removed from the surface of the insulating layer, as can be seen from FIG. 6B, and the roughness of the surface of the insulating layer is reduced from 3~4 nanometers to 0.7 nanometers.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A manufacturing method of an organic field effect transistor, comprising the following steps:
    (S1) providing a substrate;
    (S2) forming a metal gate on the substrate;
    (S3) forming an inorganic insulating layer on the substrate and the metal gate;
    (S4) performing a polishing treatment for a surface of the inorganic insulating layer;
    (S5) performing an insulating treatment by an organic filler for the inorganic insulating layer;
    (S6) forming a modified layer on the inorganic insulating layer;
    (S7) forming an organic semiconductor layer on the modified layer; and
    (S8) depositing a metal to form a source and a drain.

2. The manufacturing method as claimed in claim 1, wherein the substrate is selected from the group consisting of a glass substrate, a plastic substrate, a soft and flexible substrate, and a substrate formed of a material with a water/oxygen resistant property.

3. The manufacturing method as claimed in claim 1, wherein the metal gate is formed using a metal selected from the group consisting of chromium (Cr) and other metals of which RMS is smaller than 1 nanometer.

4. The manufacturing method as claimed in claim 1, wherein the inorganic insulating layer is selected from the group consisting of silicon dioxide ($SiO_2$) and silicon nitride ($Si_3N_4$).

5. The manufacturing method as claimed in claim 1, wherein the organic filler is selected from the group consisting of polyvinylpyrrolidone (PVP) and polymethylmethacrylate (PMMA).

6. The manufacturing method as claimed in claim 1, further comprising proceeding surface treatment of the inorganic insulating layer by using a UV/ozone method and an oxygen plasma method before the step S6.

7. The manufacturing method as claimed in claim 1, wherein, in the step S6, the modified layer is formed on the inorganic insulating layer by proceeding a surface treatment of the inorganic insulating layer using a material selected from the group consisting of hexamethyldisilazane (HMDS) and octadecyltrichlorosilane (OTS).

8. The manufacturing method as claimed in claim 1, wherein the organic semiconductor layer is composed of a material selected from the group consisting of a small molecular material, a polymeric material, and an organic material with high carrier mobility.

9. The manufacturing method as claimed in claim 8, wherein the small molecular material is pentacene.

10. The manufacturing method as claimed in claim 8, wherein the polymeric material is selected from the group consisting of derivatives of thiophene, and poly(3-hexylthiophene-2,5-diyl) (P3HT).

11. The manufacturing method as claimed in claim 1, wherein the step S8 is further performed after the step S6 to form a top-contact type field effect transistor.

* * * * *